(12) United States Patent
Chambers et al.

(10) Patent No.: US 11,519,747 B2
(45) Date of Patent: Dec. 6, 2022

(54) PAVEMENT DATA TRACKING AND MAPPING METHOD

(71) Applicant: Astec, Inc., Chattanooga, TN (US)

(72) Inventors: Mark Chambers, Rossville, GA (US); Kris Robertson, Chickamauga, GA (US); Albert Covington, Cleveland, TN (US); Chuck Simpson, Soddy Daisy, TN (US); Lien Gangte, Burnaby (CA); Naaga Kodiboyana, Chattanooga, TN (US); Mike Bass, Chattanooga, TN (US)

(73) Assignee: Astec, Inc., Chattanooga, TN (US)

( * ) Notice: Subject to any disclaimer, the term of this patent is extended or adjusted under 35 U.S.C. 154(b) by 0 days.

(21) Appl. No.: 17/732,094

(22) Filed: Apr. 28, 2022

(65) Prior Publication Data
US 2022/0252419 A1 Aug. 11, 2022

Related U.S. Application Data

(63) Continuation of application No. 16/886,942, filed on May 29, 2020, now abandoned, which is a continuation-in-part of application No. 15/597,834, filed on May 17, 2017, now Pat. No. 10,704,210.

(60) Provisional application No. 62/337,485, filed on May 17, 2016.

(51) Int. Cl.
*G01C 21/36* (2006.01)
*G06F 30/10* (2020.01)

(52) U.S. Cl.
CPC ....... *G01C 21/367* (2013.01); *G01C 21/3676* (2013.01); *G01C 21/3682* (2013.01); *G06F 30/10* (2020.01)

(58) Field of Classification Search
CPC .. G06F 30/10; G01C 21/3676; G01C 21/3682
See application file for complete search history.

(56) References Cited

U.S. PATENT DOCUMENTS

| 10,699,347 B1* | 6/2020 | Slusar | G01C 21/3461 |
|---|---|---|---|
| 2006/0247852 A1* | 11/2006 | Kortge | G01C 21/3461 |
| | | | 340/995.19 |
| 2012/0078512 A1* | 3/2012 | Schunder | G01C 21/3881 |
| | | | 701/446 |

(Continued)

*Primary Examiner* — A. Hunter Wilder
*Assistant Examiner* — Joseph M Mutschler
(74) *Attorney, Agent, or Firm* — Chambliss, Bahner & Stophel, P.C.; Stephen D. Adams

(57) ABSTRACT

A method for storing and providing pavement data related to a paved road area that includes paved roads formed by paved road portions that are each paved by a separate asphalt lot. The method includes providing a computer-based system that receives and presents pavement data related to pavement used in constructing the road. An as-built model provides a digital map of a location where the paved road area is located and is overlaid by a digital road model overlays that replicates the paved roads and includes user-selectable digital road segments for each of the paved roads. Each digital road segment corresponds to and is based on only one of road portions. A pavement data set is associated with each digital road segment and includes pavement data related to the asphalt lot used in forming the road portion. When a digital road segments is selected, corresponding pavement data is displayed.

20 Claims, 8 Drawing Sheets

(56) References Cited

U.S. PATENT DOCUMENTS

2017/0058467 A1* 3/2017 Marsolek ................ E01C 19/10
2018/0058870 A1* 3/2018 Gaebler ................ G08G 1/093

* cited by examiner

PAVEMENT DATA TRACKING AND MAPPING METHOD

CROSS-REFERENCES TO RELATED APPLICATIONS/PATENTS

This is a continuation application of application Ser. No. 16/886,942, filed May 29, 2020, and entitled "PAVEMENT DATA TRACKING AND MAPPING SYSTEM," which is a continuation-in-part application of application Ser. No. 15/597,834, filed on May 17, 2017, and entitled "SYSTEM AND METHOD FOR ASPHALT MIX TRACKING," which relates back to and claims the benefit of priority from U.S. Provisional Application for Patent Ser. No. 62/337,485, filed on May 17, 2016, and entitled "MIX TRACKING SYSTEM"; wherein the entire contents of the foregoing applications are hereby incorporated by reference in their entireties.

FIELD OF THE INVENTION

The present invention relates generally to systems and methods for tracking and providing road pavement data. More particularly, the present invention relates to a system and method for tracking and presenting pavement data, including pavement composition data and location data, in a map and map overlay in response to a user selecting one of two or more user-selectable portions.

BACKGROUND AND DESCRIPTION OF THE PRIOR ART

It is known to use systems and methods to track asphalt mix. Conventional systems and methods, however, suffer from one or more disadvantages. For example, conventional asphalt mix tracking systems and methods do not track the asphalt mix from the mixing site all the way to the paving site. Conventional asphalt mix tracking systems and methods also do not install identification means in the paved roadway at intervals. Conventional asphalt mix tracking systems and methods do not sufficiently provide the age of the paved roadway or the origin or composition of its asphalt mix at a later date. In addition, conventional asphalt mix tracking systems and methods do not permit such data to be collected via a vehicle while its travels on the paved roadway. Conventional asphalt mix tracking systems and methods also do not efficiently share data with multiple parties. Still further, conventional systems fail to present stored pavement data in an easily understood and navigated visual format for discrete portions of a roadway.

What is needed, therefore, is a tracking and mapping system for tracking and presenting pavement data related to a paved road area to a system user that addresses the above and other disadvantages.

NOTES ON CONSTRUCTION

The use of the terms "a", "an", "the" and similar terms in the context of describing the invention are to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. The terms "substantially", "generally" and other words of degree are relative modifiers intended to indicate permissible variation from the characteristic so modified. The use of such terms in describing a physical or functional characteristic of the invention is not intended to limit such characteristic to the absolute value which the term modifies, but rather to provide an approximation of the value of such physical or functional characteristic. All methods described herein can be performed in any suitable order unless otherwise specified herein or clearly indicated by context.

The use of any and all examples or exemplary language (e.g., "such as" and "preferably") herein is intended merely to better illuminate the invention and preferred embodiments thereof, and not to place a limitation on the scope of the invention. Nothing in the specification should be construed as indicating any element as essential to the practice of the invention unless so stated with specificity.

As used herein, the term "measuring device" means any device, mechanism, assembly, or combination thereof that is adapted to determine one or more characteristics of an object or material such as an asphalt mix. The term "measuring device" includes without limitation aggregate weighbridges, recycle weighbridges, temperature sensors, bin scales, bin on-load cells, truck scales, hopper scales, batching scales, metering pumps, bin level indicators, tank level indicators, Coriolis meters, load cells, pressure sensors, moisture probes, drive speed encoders, belt speed encoders, no-rotation sensors, bin weighbridges, and the like.

As used herein, the term "controller" means any device, mechanism, assembly, or combination thereof that is adapted to control an application or process using computer logic. The term "controller" includes without limitation programmable logic controllers, microcontrollers, and microprocessors.

As used herein, the term "server" means any program, process, device, mechanism, assembly, or combination thereof that is adapted to electronically communicate with a controller as defined above and be electronically accessed by remote devices. The term "server" includes without limitation programs, processes, devices, mechanisms, assemblies, and combinations thereof that are electronically connected to a network of controllers and are adapted to provide a service in response to a request from one or more controllers. The term "server" further includes without limitation programs, processes, devices, mechanisms, assemblies, and combinations thereof that are adapted to provide a service to one or more controllers on a publish-subscribe basis. The term "server" still further includes without limitation application servers, catalog servers, communications servers, computing servers, database servers, the Internet, the "cloud," and the like.

As used herein, the term "tag" means any device, mechanism, assembly, or combination thereof that is adapted to be attached to or placed in the object or material being measured by the measuring device. The term "tag" includes without limitation devices, mechanisms, assemblies, and combinations thereof that are adapted to wirelessly communicate with a reader as defined below. The term "tag" further includes without limitation active, passive, battery-operated passive, and field-programmable tags.

As used herein, the term "reader" means any device, mechanism, assembly, or combination thereof that is adapted to wirelessly communicate with a tag as defined above and a controller as defined above. The term "reader" includes without limitation passive and active readers. The term "reader" further includes without limitation fixed and mobile readers.

SUMMARY OF THE INVENTION

The above and other needs are met by embodiments of a method for storing and providing historical pavement data related to a selected paved road portion of a paved road area having one or more paved roads that each include a plurality of paved road portions that are each paved by a separate asphalt lot. The method includes the step of providing a computer-based tracking and mapping system that is configured to receive, store, track, and present to a user of the system pavement data related to pavement used in constructing the road portions. With the tracking and mapping system, an as-built model of the paved road area that is provided. The as-built model provided includes a digital map of a real-world location where the paved road area is located. The as-built model provided also includes a digital road model that overlays onto the digital map and that replicates one or more of the paved roads. The digital road model includes a plurality of user-selectable digital road segments for each of the one or more paved roads. Preferably, each of the user-selectable digital road segments corresponds to and is created in the digital road model based on only one of the plurality of road portions of one of the paved roads. The as-built model provided includes a unique pavement data set associated with each of the user-selectable digital road segments that includes pavement data related to the asphalt lot used in forming the corresponding one road portion. The method also includes the step of, in response to one of the displayed user-selectable digital road segments being selected, updating a display of a user device to replicate and display a portion of the unique pavement data set that corresponds to the selected digital road segment with the tracking and mapping system.

The present disclosure also provides embodiments of a method for creating an as-built model of a paved road area having one or more paved roads that each include a plurality of road portions that are each paved by a separate asphalt lot. The method includes the step of providing a computer-based tracking and mapping system that is configured to receive, store, track, and present to a user of the system pavement data related to pavement used in constructing the paved road area. Paving data that is related to one or more paved roads is received with the tracking and mapping system. The paving data for each paved road includes pavement data including an identification of the asphalt lot used in forming each of the road portions and geographic coordinates identifying a location of each of the road portions of the paved road. Based on the paving data, the tracking and mapping system creates an as-built model of the paved road area. The as-built model includes a digital map of a real-world location where the paved road area is located. The as-built model also includes a digital road model that that overlays onto the digital map and replicates the paved road. The digital road model includes a plurality of user-selectable digital road segments for each of the one or more paved roads and each of the user-selectable digital road segments corresponds to and is created in the digital road model based on only one of the plurality of road portions of one of the paved roads. Finally, the as-built model includes a unique pavement data set for each of the road portions, and each includes the paving data for the corresponding one road portion.

BRIEF DESCRIPTION OF THE DRAWINGS

The presently preferred embodiments of the invention are illustrated in the accompanying drawings, in which like reference numerals represent like parts throughout, and in which.

DETAILED DESCRIPTION

Figure 1:
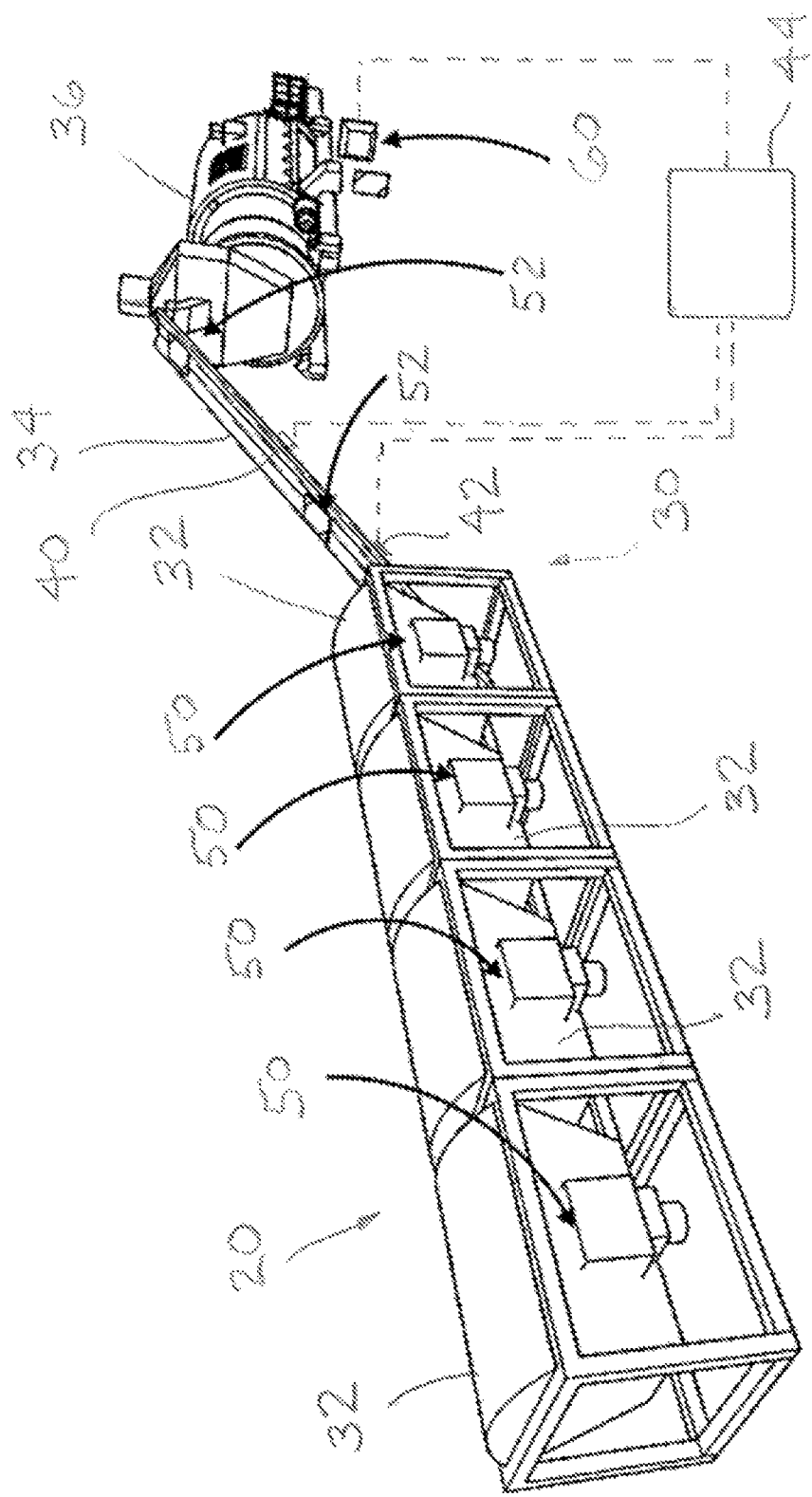
FIG. 1 is a perspective view of a mixing site having an asphalt tracking system according to an embodiment of the present invention.

Referring now to the drawings, a preferred embodiment of the system and method for asphalt mix tracking in accordance with the present invention is illustrated by FIGS. 1 through 5. As shown in FIGS. 1-5, the system and method for asphalt mix tracking is adapted to substantially continuously track the asphalt mix from the mixing site all the way to the paving site. The system and method for asphalt mix tracking also installs an identification means in a paved roadway at intervals. The system and method for asphalt mix tracking further provides the age of the paved roadway or the origin or composition of its asphalt mix at a later date. The system and method for asphalt mix tracking still further permits such data to be collected via a vehicle while its travels on the paved roadway. The system and method for asphalt mix tracking also efficiently shares data with multiple parties via remote devices. In addition, the system and method for asphalt mix tracking facilitates the reclamation and recycling of asphalt pavement. The system and method for asphalt mix tracking further reduces waste and costs.

Referring now to FIG. 1, a perspective view of an exemplary mixing site utilizing an embodiment of the asphalt tracking system in accordance with the present invention is illustrated. As shown in FIG. 1, the exemplary mixing site is designated generally by reference numeral 20 and asphalt tracking system is designated generally by reference numeral 30. Exemplary mixing site 20 comprises a plurality of bins 32 adapted to receive, hold, and dispense components of asphalt mix such as aggregate material. Exemplary mixing site 20 also comprises conveyor 34 adapted to convey the asphalt mix from bins 32 to dryer 36.

Asphalt tracking system 30 is adapted to substantially continuously track an asphalt mix from a mixing site to a paving site and comprises a data collection system adapted to determine at least one characteristic of the asphalt mix. The data collection system comprises a plurality of measuring devices such as weighbridge 40 and moisture sensor 42 that are adapted to determine a plurality of physical properties of the asphalt mix and communicate that data to data control system 44. The data control system is adapted to receive data from the data collection system and comprises a controller that is adapted to communicate such data to a server. The server is adapted to communicate such data to remote devices such as smartphones, tablets, laptop computers, desktop computers, and the like.

Asphalt tracking system 30 also comprises a lot tracking system. The lot tracking system is adapted to track a lot or batch of the asphalt mix and comprises one or more dispensers 50 that are adapted to inject one or more tags 52 into the asphalt mix. It is contemplated within the scope of the invention that dispensers 50 may inject tags 52 at predetermined regular intervals, but it is also contemplated within the scope of the invention that the dispensers may inject tags at irregular intervals or upon the determination of an out-of-specification asphalt mix and upon the return to in-specification asphalt mix. It is also contemplated within the scope of the invention that dispensers 50 may be disposed on bins 32 or any other suitable location at mixing site 20.

Tags 52 comprise one or more RFID tags. The RFID tags comprise an integrated circuit for storing and processing information, modulating and demodulating a radio frequency (RF) signal, collecting DC power from a reader signal, and other specialized functions. The RFID tags also comprise an antenna for receiving and transmitting the signal. The RFID tag information is stored in a non-volatile memory. The RFID tag includes either fixed or programmable logic for processing the information.

Tags 52 are adapted to communicate with readers 60. More particularly, tags 52 are adapted to communicate a unique identification or serial number which will be correlated to the lot or batch or asphalt mix in which they have been placed. Preferably, tags 52 are of approximately the same size and weight as the aggregate material in which they are placed in order to minimize or eliminate any upstream or downstream movement of the tags relative to the asphalt mix as the tags and asphalt mix are conveyed through the mixing site.

Readers 60 are adapted to communicate with tags 52 and data control system 44. More particularly, readers 60 are adapted to receive the unique identification or serial number from tags 52. Readers 60 include one or more RFID readers adapted to transmit an encoded radio signal to interrogate tags 52. The RFID tag 52 receives the message and then responds with its unique identification or serial number or other information such as a stock number, a lot or batch number, a production date, and the like. Because RFID tags 52 have unique identification or serial numbers, RFID reader 60 can discriminate among several tags that might be within the range of the reader and read them simultaneously. Preferably, readers 60 are placed at stationary locations at the mixing site, but it is contemplated within the scope of the invention that the readers may be mobile.

Figure 2:
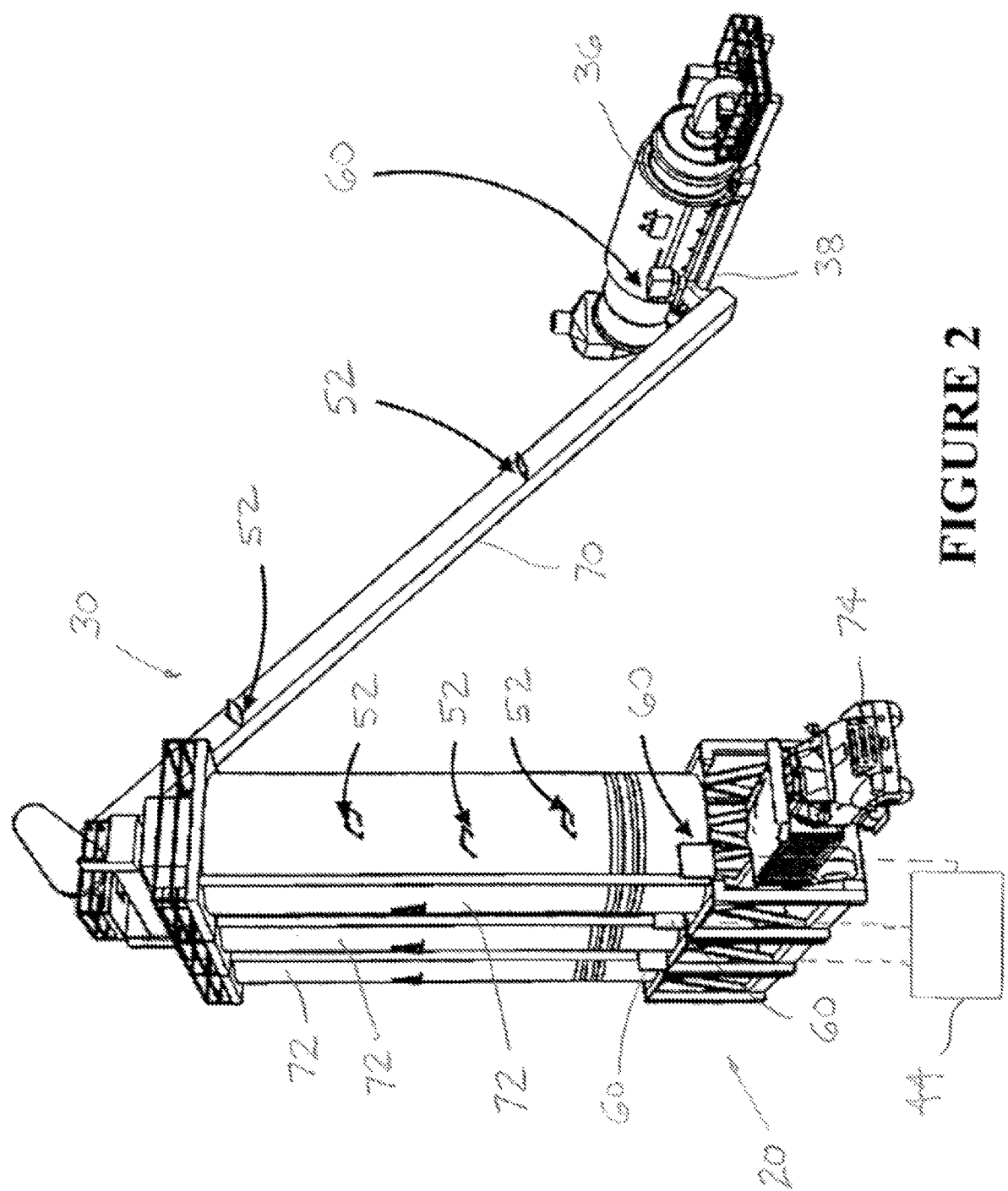
FIG. 2 is a perspective view of a mixing site having an asphalt tracking system according to an embodiment of the present invention.

Referring now to FIG. 2, a perspective view of exemplary mixing site 20 utilizing asphalt tracking system 30 is illustrated. As shown in FIG. 2, tracking system 30 comprises dryer 36, mixer 38, a plurality of tags 52, a plurality of readers 60, conveyor 70, a plurality of silos 72, and truck 74.

Figure 3:
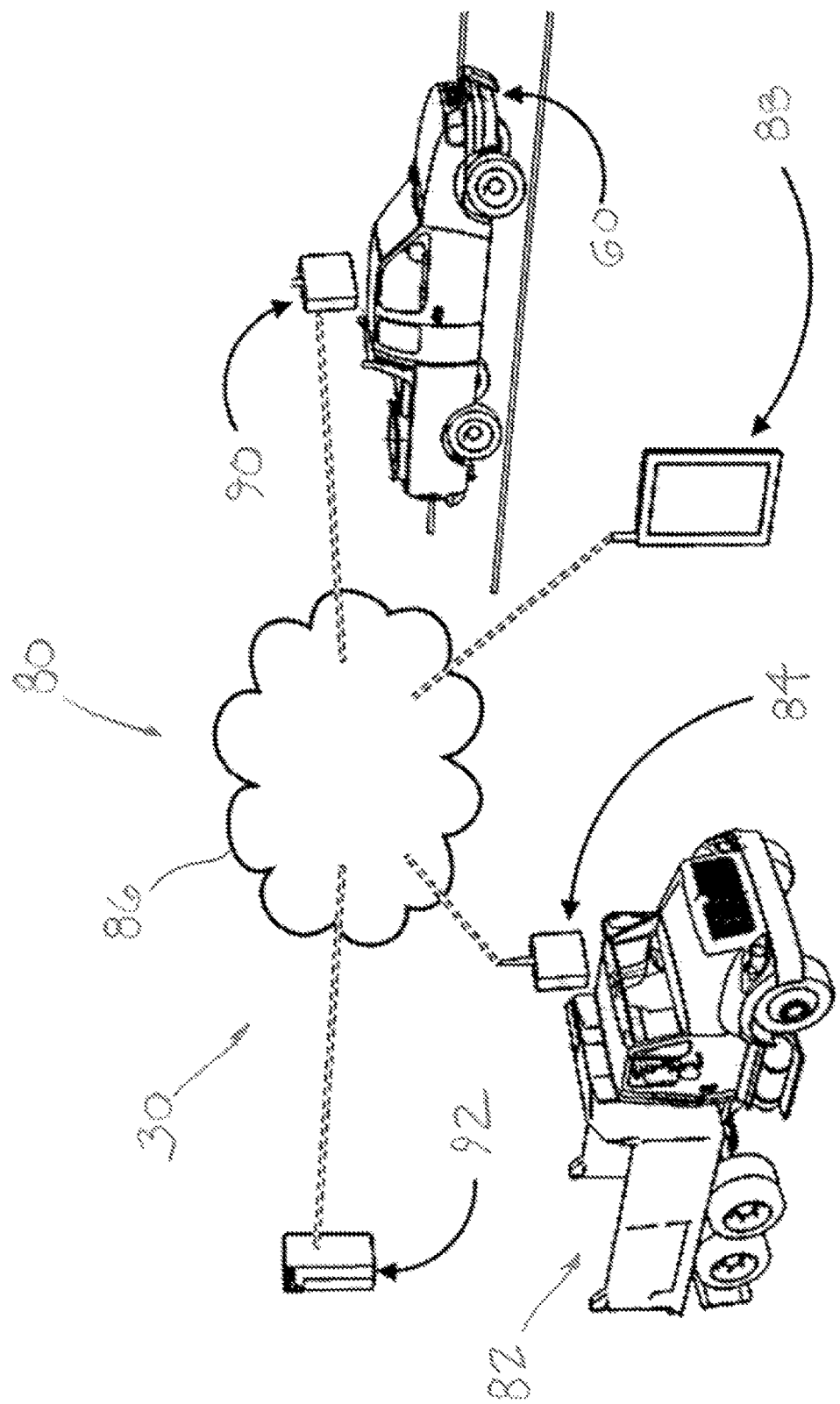
FIG. 3 is a perspective view of a communication network utilizing an asphalt tracking according to an embodiment of the present invention.

Referring now to FIG. 3, a perspective view of an exemplary communication network utilizing asphalt tracking system 30 is illustrated. As shown in FIG. 3, the exemplary communication system is designated generally by reference numeral 80. Exemplary communication system includes truck tracking system 82 which is adapted to track truck 74 as it travels from the mixing site to the paving site. Truck tracking system 82 comprises GPS device 84 which is adapted to communicate with server 86. Server 86 is also adapted to communicate with remote devices such as smartphone 88 and laptop computer 90 and produce paperless sales ticket 92.

Figure 4:
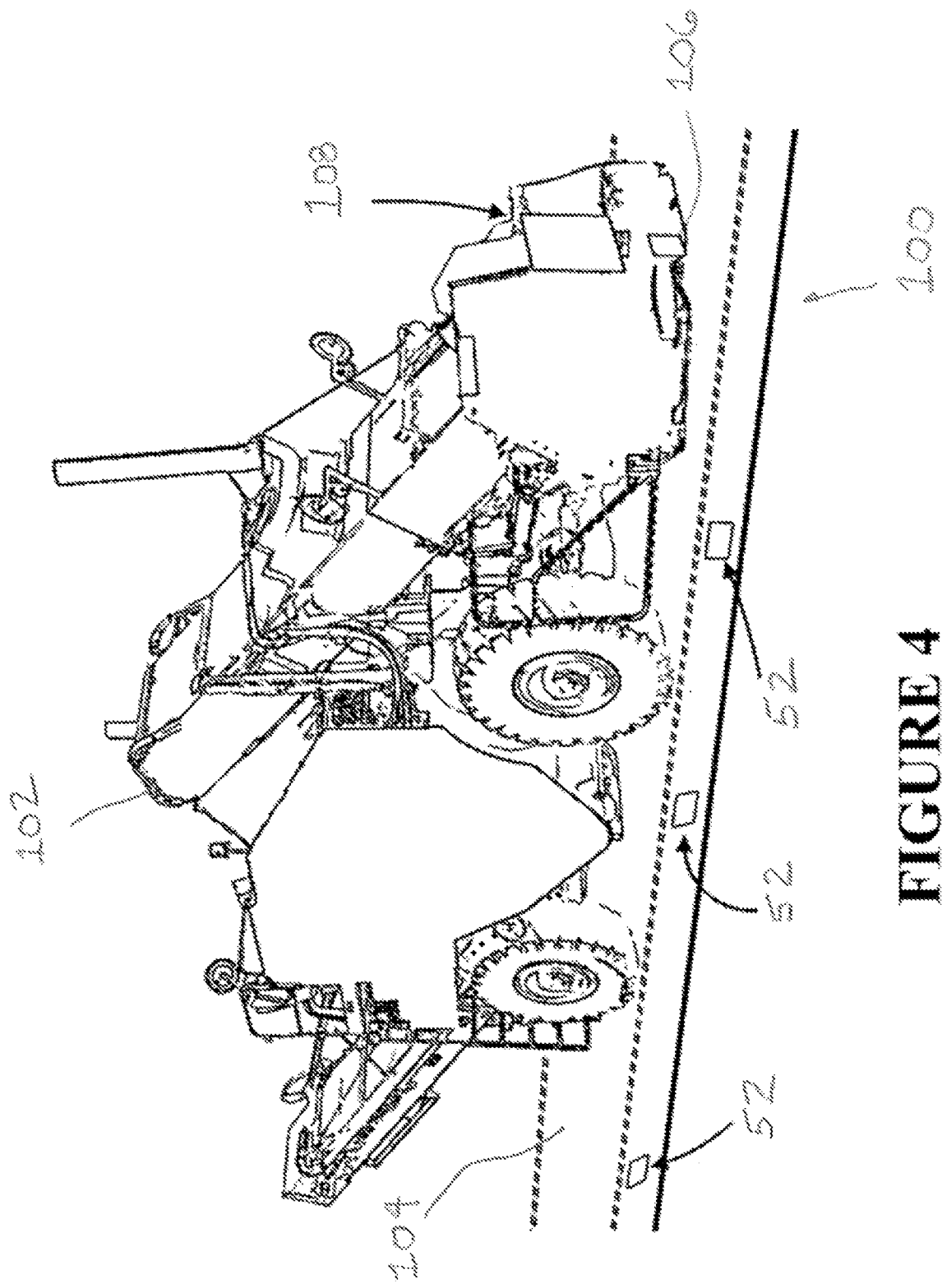
FIG. 4 is a perspective view a paving site utilizing an asphalt tracking system according to an embodiment of the present invention.

Referring now to FIG. 4, a perspective view an exemplary paving site utilizing asphalt tracking system 30 is illustrated. As shown in FIG. 4, the exemplary paving site is designated generally by reference numeral 100. Exemplary paving site 100 comprises material transfer vehicle 102, asphalt mat 104, and a pavement injection system. Pavement injection system is adapted to identify the lot or batch of the asphalt mix and comprises a plurality of tags 52, paving site dispenser 106, and paving site reader 108. While FIG. 5 illustrates material transfer vehicle 102, it is contemplated within the scope of the invention that the pavement injection system may include a paver or a person for injecting tags into the asphalt mat.

Figure 5:
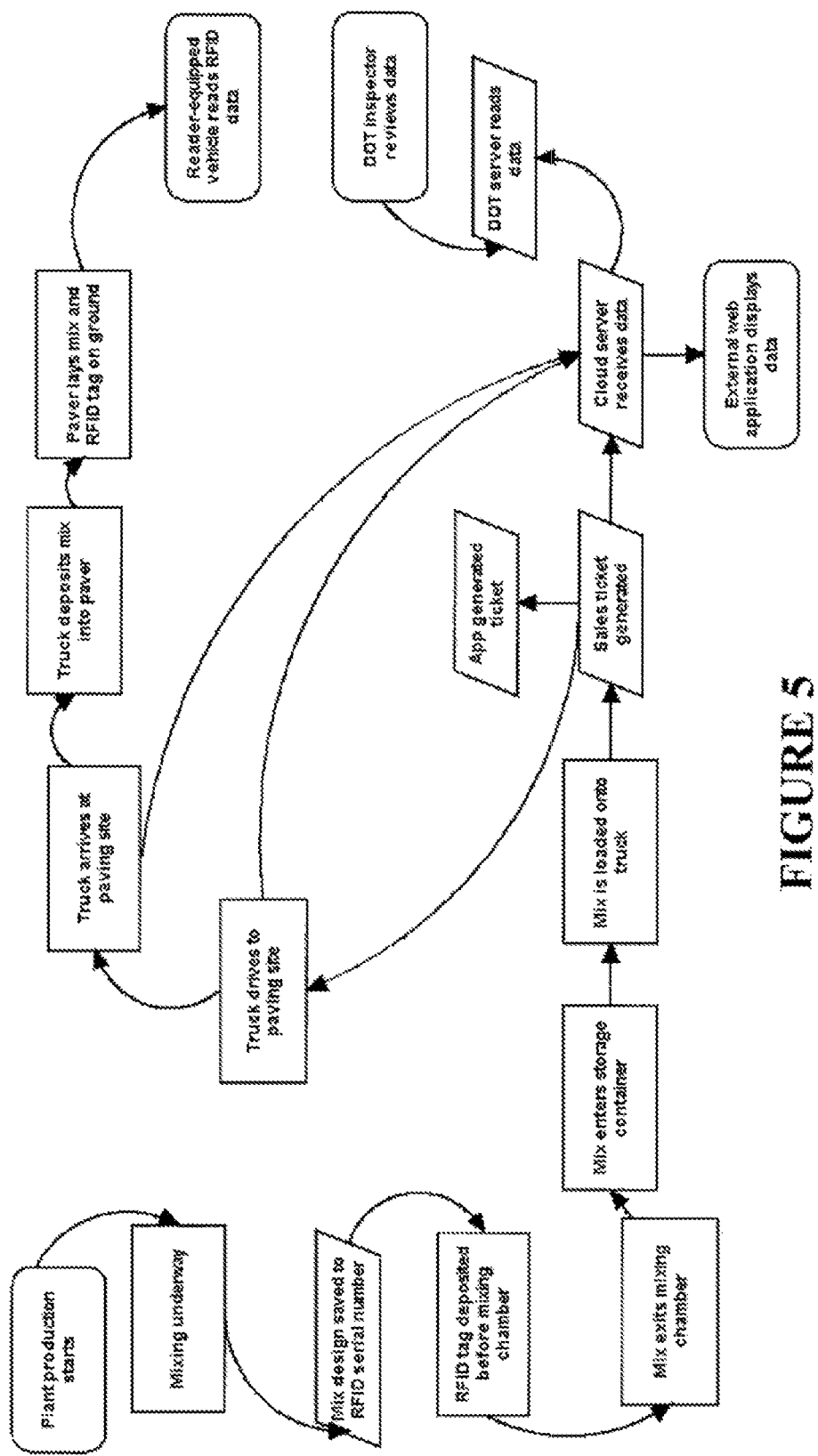
FIG. 5 is a flow chart illustrating a method for tracking an asphalt mix according to an embodiment of the present invention.

Referring now to FIG. 5, a flow chart of a method for tracking an asphalt mix in accordance with the present invention is illustrated. One method for tracking an asphalt mix comprises providing an asphalt mix tracking system. The asphalt mix tracking system comprises a data collection system that is adapted to determine at least one characteristic of the asphalt mix, a data control system that is adapted to receive data from the data collection system, a lot tracking system that is adapted to track a lot of the asphalt mix, a truck tracking system that is adapted to track a truck, and a pavement injection system that is adapted to identify the lot of the asphalt mix. The asphalt mix tracking system is adapted to substantially continuously track the asphalt mix from a mixing site to a paving site. The method for tracking an asphalt mix also comprises determining the at least one characteristic of the asphalt mix, communicating the at least one characteristic of the asphalt mix to the data control system, transporting the asphalt mix from the mixing site to the paving site, and injecting an identification means at the paving site.

In other embodiments of the method for tracking an asphalt mix, the method further comprises communicating the at least one characteristic of the asphalt mix from the data control system to a server and communicating the at least one characteristic of the asphalt mix from the server to a remote device. In still other embodiments of the method for tracking an asphalt mix, the method comprises injecting a tag into the asphalt mix at the mixing site and injecting a tag into the asphalt mix at the paving site. In other embodiments of the method for tracking an asphalt mix, the method further comprises monitoring the temperature of the asphalt mix from the mixing site to the paving site, measuring the amount of time the asphalt mix is at the mixing site, measuring the amount of time the asphalt mix is in transit between a bin and a point of mixing, measuring the amount of time the asphalt mix is in transit between a point of mixing and a silo, and measuring the amount of time the asphalt mix is in transit between the mixing site and the paving site.

In operation, several advantages of the system and method for asphalt mix tracking are achieved. For example, the system and method for tracking an asphalt mix substantially continuously monitor the asphalt mix from the mixing site to the paving site. The system and method for asphalt mix tracking identify and tag an out-of-specification lot or batch of asphalt mix, or any portion thereof. By so doing, the system and method for asphalt mix tracking reduce waste and costs and provide only in-specification asphalt mix to paving sites. The system and method for asphalt mix tracking also provide valuable data relating to the reclamation, recycling, durability, and lifespan of an asphalt mix. Further, the system and method for asphalt mix tracking permit data to be collected and reviewed long after the pavement is laid and via a vehicle equipped with a reader. In addition, the system and method provide valuable data to multiple remote devices and users, including a Department of Transportation inspector, over a variety of platforms.

In addition, the lot tracking system is adapted to track segments (i.e., lots) of material from the point of mix through the storage silos and into the truck. Lots are numbered and lot numbers on loadout tickets identify which lot the materials in each truck came from. Each lot record includes the lot number, time and date, a calibration security code (which changes upon any change to the mix, making it possible to identify unique calibrations), the name of the formula running, and any alarm conditions. The percentage and flow rate of each ingredient are also recorded, as well as lot size and/or duration and/or start/stop times. Average mix temperatures for the lot are recorded. This information may be printed and/or uploaded to a cloud server.

Further, the truck tracking system uses GPS and RFID technologies to track the location of trucks and provide a detailed timing log. The log charts when the truck arrived at the plant, when it was loaded, the ticket number, material ID, truck ID, hauler ID, time of departure from the plant, time of arrival at the job site, and return trip details.

Still further, the data control system is adapted to receive data from the data collection system and upload the data to a cloud server. The truck driver may keep a physical copy of the data as a failsafe. A tablet in possession of a DOT official, a contractor, or an asphalt producer will be able to download the load data from the server. This streamlined process will eliminate the need to key in ticketing data for asphalt loads, improve customer satisfaction, and reduce labor requirements. Information will be written to RFID tags that will be injected into the mix itself. In this way, the tags will be embedded into the road at regular intervals.

Finally, the pavement injection system uses the RFID tags injected into the road to provide a long-term record of the composition, age, and origin of the pavement. Vehicles equipped with an RFID reader will be able to travel the road and collect mix data. When the road has reached its lifespan, these sensors will provide reclamation data, such as asphalt cement percentage of the pavement, making the recycled material easier for contractors to re-use.

Figure 6:
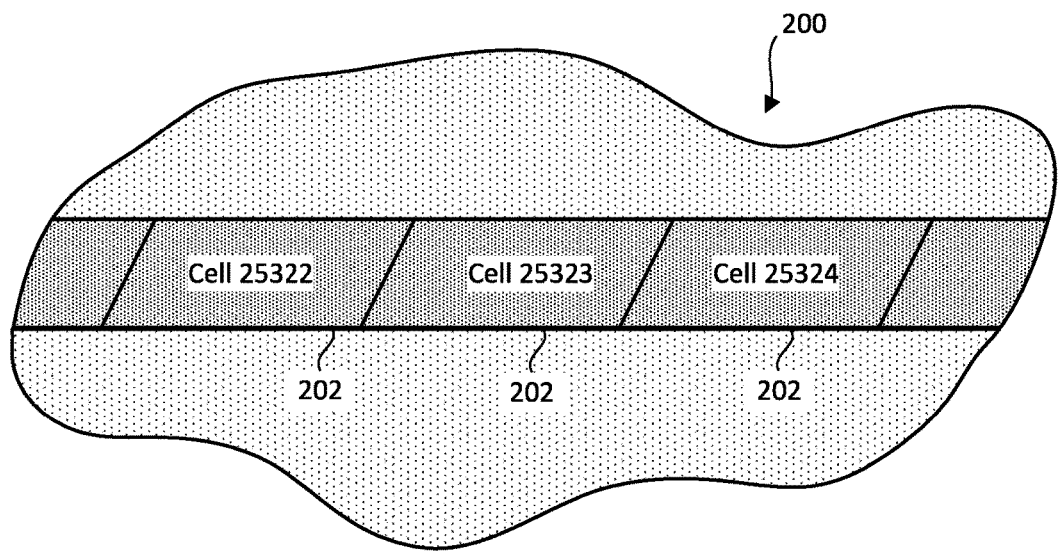
FIG. 6 depicts a portion of a paved road area in a real-world location.

With reference now to FIG. 6, there is illustrated a paved road area 200 that is formed by a plurality of road portions 202 (i.e., cells 25322, 25323, 25324, etc.) that are each created using one or more lots or batches lot of the asphalt mix. Typically when a road surface is created, several trucks sequentially travel from the asphalt production facility to a paving site carrying a single lot of asphalt mix. Once at the paving site, the trucks deposit their load of asphalt mix to the paving location to form a single road portion 202 and then leave the paving site.

Figure 7:
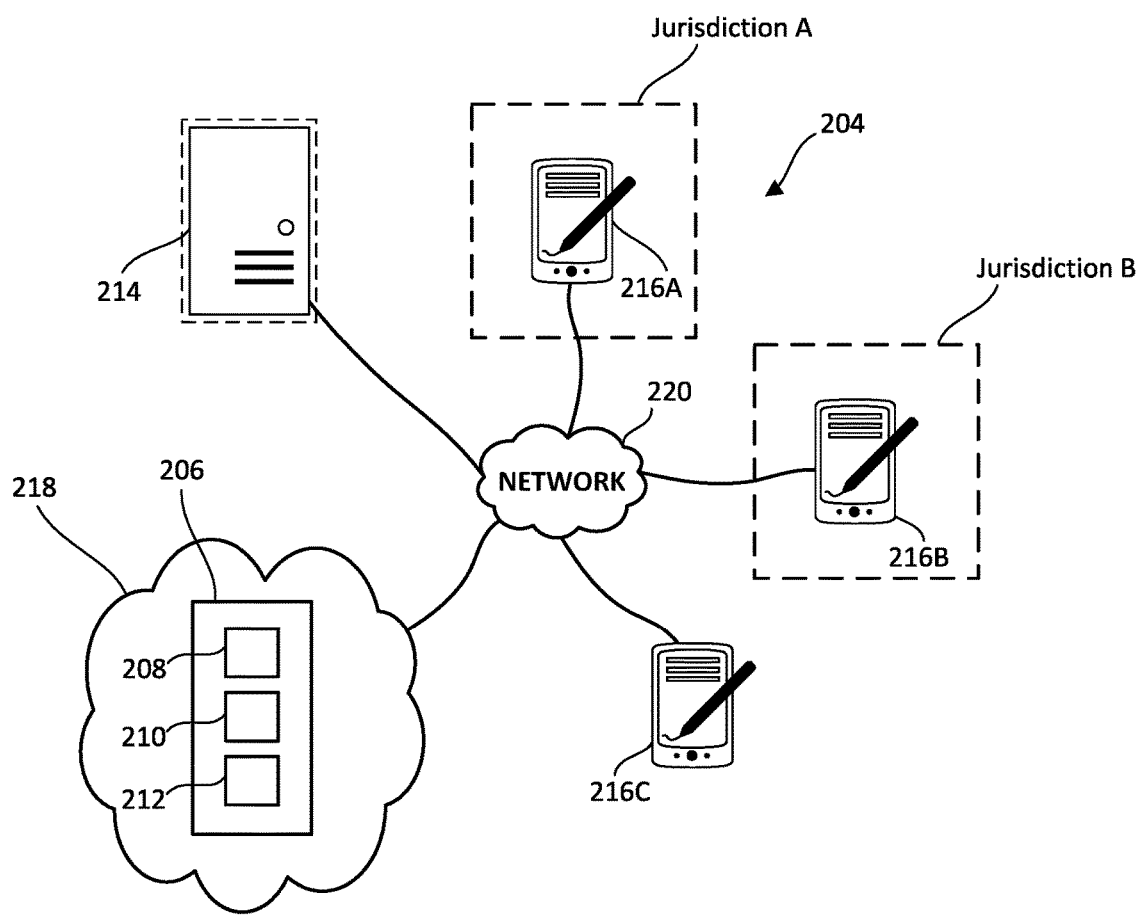
FIG. 7 depicts a computer-based tracking and mapping system for generating a model of a paved road area according to an embodiment of the present invention.

FIG. 7 illustrates a computer-based tracking and mapping system 204 for tracking and presenting pavement data related to pavement used in the construction of paved road areas and paved road portions, such as the paved road area 200 and road portions 202 illustrated in FIG. 6. System 204 is configured to generate an "as built" model 206 of the paved road area 200 that provides a long-term record and, preferably, that includes a graphical re-creation of the paved road area and that presents data related to the paved road area in an easy to visualize and navigate format. The model 206 includes a digital map 208 of a real-world location where the paved road area 200 is located, a digital reconstruction 210 (sometimes also called a "map overlay") of at least a portion of the paved road area that is overlaid onto the map, and a data set 212 that provides a variety of information related to the paved road area, including location information about the paved road area, pavement information (e.g., pavement mix composition), and pavement site information (e.g. date/time of pavement process, ambient temperature, etc.), etc.

In preferred embodiments, this model 206 is created by one or more servers 214, which generate the map 208 and overlay the reconstruction 210 onto the map and also store the data set 212 and associate portions of the information in the data set with the correct portion of the model, as further detailed below. Additionally, a user device 216 (user devices 216A, 216B, and 216C are illustrated) having a display is configured to display the model 206, including the map 208, map reconstruction 210, and data from data set 212 that are provided by the server 214. In some embodiments, the server 214 that generates the model 206 is the same machine that functions as the user device 216. However, in preferred embodiments, one or more user devices 216 are each in remote communication with the server 214. Preferably, the model 206, including particularly the pavement data set 212, may be simultaneously and remotely accessed by a plurality of user devices 216. In this regard, in preferred embodiments, the model 206 including the data set 212, or at least a portion thereof, are stored to a cloud-based, remotely accessible storage 218 that may be accessed by the servers 214 and user devices 216 over a wireless network 220 (e.g., Internet). Additionally, server 214 and user devices 216 may communicate to each other directly or over wireless network 220.

In certain embodiments, the model 206 or portions thereof, such as the pavement data set 212, is segregated into one or more sub-portions via access restrictions. This would allow, for example, a first group of users to have access only to a first portion of the data set 212 and a second group of users to have access only to a second portion of the data set. It is further contemplated that a third group of users (e.g., administrative accounts) may have access to some or all of the access restricted accounts or access restricted data, such as the first and second portions of the data set. In certain embodiments, the access restrictions are geographical restrictions. This would allow, for example, users 216A (e.g., city officials, city planners, etc.) in a first geographical jurisdiction (e.g. Jurisdiction A) to access a first portion of the data set (e.g. sub-portion A) and users 216B in a second geographical jurisdiction (e.g. Jurisdiction B) to access a second portion of the data set (e.g. sub-portion B). However, in the above example, users from Jurisdiction A would not have access to sub-portion B of the data and users from Jurisdiction B would not have access to sub-portion A of the data. However, a third group of users 216C (e.g. Department of Transportation personnel) may be allowed access to all data, including sub-portions A and B for that particular state.

Figure 8:
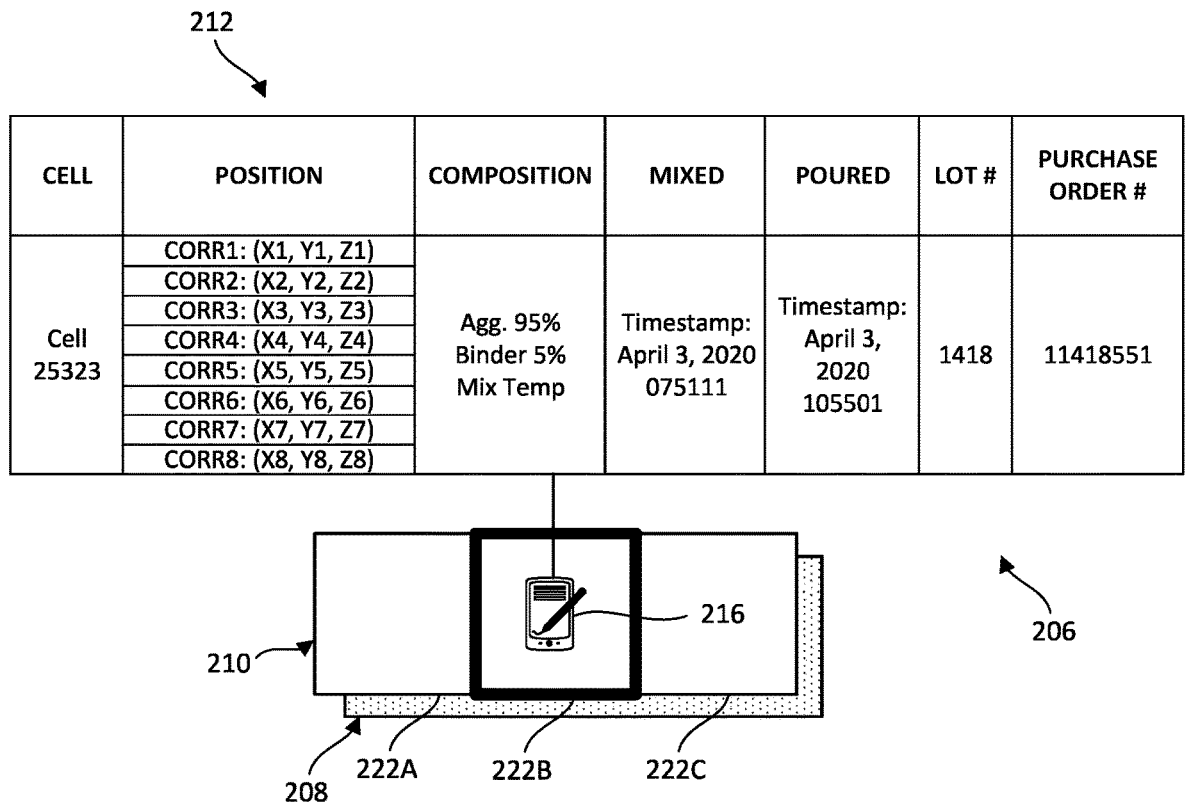
FIG. 8 depicts a computer-based tracking and mapping system for generating a model of a paved road area according to a second embodiment of the present invention.

With reference to FIG. 8, another example model 206 for the paved road area 200 in FIG. 6 is illustrated. In this case, the model 206 includes a map 208 of the paved road area, and a digital reconstruction 210 of the paved road itself that includes three user-selectable digital road segments 222 (road segments 222A, 222B, and 222C are illustrated) that each correspond to one of the three road portions 202 (i.e., cells 25322, 25323, 25324) of the paved road area 200. These user-selectable road segments 222 may be selected via user input into a user device 216, such as clicking or highlighting a portion of the model 206, etc. However, in other embodiments, a road segment 222 may be automatically selected by locating the user device 216 at the corresponding road portion 202. For example, the user device 216 may be configured to wirelessly communicate geographic coordinates of its current location to the server (not shown) that is generating the model 206. When the location information provided by the user device 216 indicates that the user device is at a particular road portion, a corresponding road segment 222 may be automatically selected and information related to the particular road segment would be displayed for the user on the user device. This would be beneficial, for example, a Department of Transportation inspector to automatically obtain information related to a portion of a road simply by walking or driving over it.

Preferably, a unique pavement data set 212 is associated with each of the digital road segments 222 (one of which is illustrated in FIG. 8). In preferred embodiments, the digital road segments 222 each correspond to a different lot of paving material. Thus, each of the data sets 212 includes a unique record of information that relates only to that particular lot of paving material and preferably not to other lots of paving material. When a user selects one of the road segments 222, at least a portion of the corresponding data set 212 is automatically displayed to the user via the user device. Thus, the model 206 provides a way of storing data related to a particular lot of paving material, associating that data with a particular location of a paved road area, and makes that information readily available to the user but does not overwhelm the user with excessive information that concerns other unrelated portions of the road surface.

Preferably, the data sets 212 each include two or more different geographic coordinates that define each of the road portions 202 of the paved road area 200 to which the selected road segment corresponds. For example, in preferred embodiments, each data set 212 includes a first geographic coordinate that represents the location where the paving process using a particular lot of paving material began and a second geographic coordinate that represents the location where the paving process using that same particular lot of paving material ended. In some cases, certain of these geographic coordinates will be repeated in the data sets 212 of multiple digital road segments 222. For example, the data sets 212 tied to road segments 222 for two immediately adjacent road portions 202 (e.g. cells 25322 and 25323, shown in FIG. 6) could share a geographic coordinate. This geographic coordinate would be located at the intersection between the first road portion and the second road portion. However, in other cases, each data set 212 would contain only unique geographic coordinates. This would occur, for example, in cases where the model 206 includes road segments 222 that correspond to road portions 202 that are not immediately adjacent one another (e.g. cells 25322 and 25324).

Figure 9:
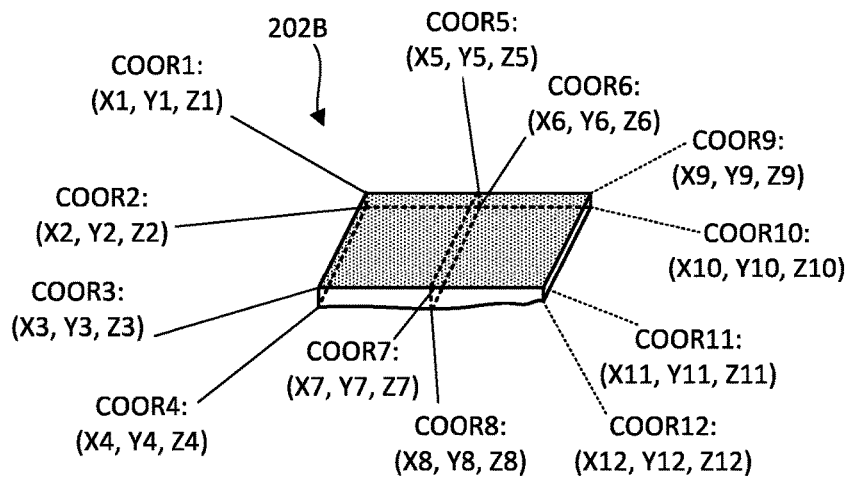
FIG. 9 illustrates a portion of a paved road area that corresponds to the a selected (i.e., depicted by bolded lines) digital road segment numbered "222B" in FIG. 8 that is defined by three-dimensional geographic coordinates.

With continued reference to FIG. 8 and with further reference to FIG. 9, digital road segment 222B corresponds to a portion 202B of the paved road area that is defined by eight (8) three-dimensional geographic coordinates (COOR1 thru COOR8), which define the top and bottom coordinates of four corners. In certain embodiments, road segments 222 correspond to road portions that are defined by two or more geographic coordinates that are vertically displaced from one another (e.g., COOR1 and COOR2). In certain preferred cases, pairs of vertically displaced coordinates are aligned (i.e., same lateral and longitudinal position). By comparing these geographic coordinates, the thickness of the corresponding road portion 202 may be determined. In certain embodiments, road portions 222 correspond to road portions 202 that are defined by two or more geographic coordinates that are longitudinally displaced from one another (e.g., COOR1 and COOR5). By comparing these geographic coordinates, a length measurement for the corresponding road portion 202 may be determined. Finally, in certain embodiments, road portions 222 correspond to road portions 202 that are defined by two or more geographic coordinates that are laterally displaced from one another (e.g., COOR1 and COOR3). By comparing these geographic coordinates, a width measurement for the corresponding road portion 202 may be determined. By providing a sufficiently high number of geographic coordinates for each road portion 202 that are preferably located across the road surface (including vertically, longitudinally, and laterally) an "as built" model of the road can be re-created that includes an approximation of the shape, including the thickness, length, width, and direction, of the road. Again, each of these road portions 202 may be visually represented in the model 206 as a single user-selectable road segment 222.

As discussed above, truck tracking system 82 (shown in FIG. 3) comprises GPS device 84 which is adapted to communicate with server 86. This same GPS-equipped truck tracking system 82 or another similarly equipped vehicle (e.g. a GPS-equipped road paving train) may be used in the creation of a model of the paved road (such as the model 206 shown in FIG. 8). In preferred embodiments, the road paving train is configured to continuously or periodically communicate its geographic coordinates to server 214 (which may be server 86, shown in FIG. 3). Preferably, as these geographic coordinates are provided to server 214, the corresponding data set 212 is automatically updated to include those coordinates substantially in real time as the road area is paved. For example, as the road is paved and the model shown in FIG. 8 is updated, additional three-dimensional coordinates COOR9-COOR12, etc. would be added to the data set 212 as the road was paved. Updating the data set 212 with these coordinates further define the road portion 202 that is represented by that particular user-selectable road segment 222. As such, this method allows for the model 206 to capture the precise location of each lot of paving material.

Preferably, the data set 212 includes sufficient information that the width, length, and thickness of the paved road surface can be obtained. This may be accomplished, for example, by tracking some or all of the following: the position of the road paving train (including the road paving machine itself), the speed of the road paving train, the rate and volume of deposition of road paving material onto a road surface, the time of deposition, and the height and width of the deposited road paving material. Preferably, this information is combined with the geographic coordinate data and provided to the server 214 to update the pavement data 210 substantially in real time.

Figure 10:
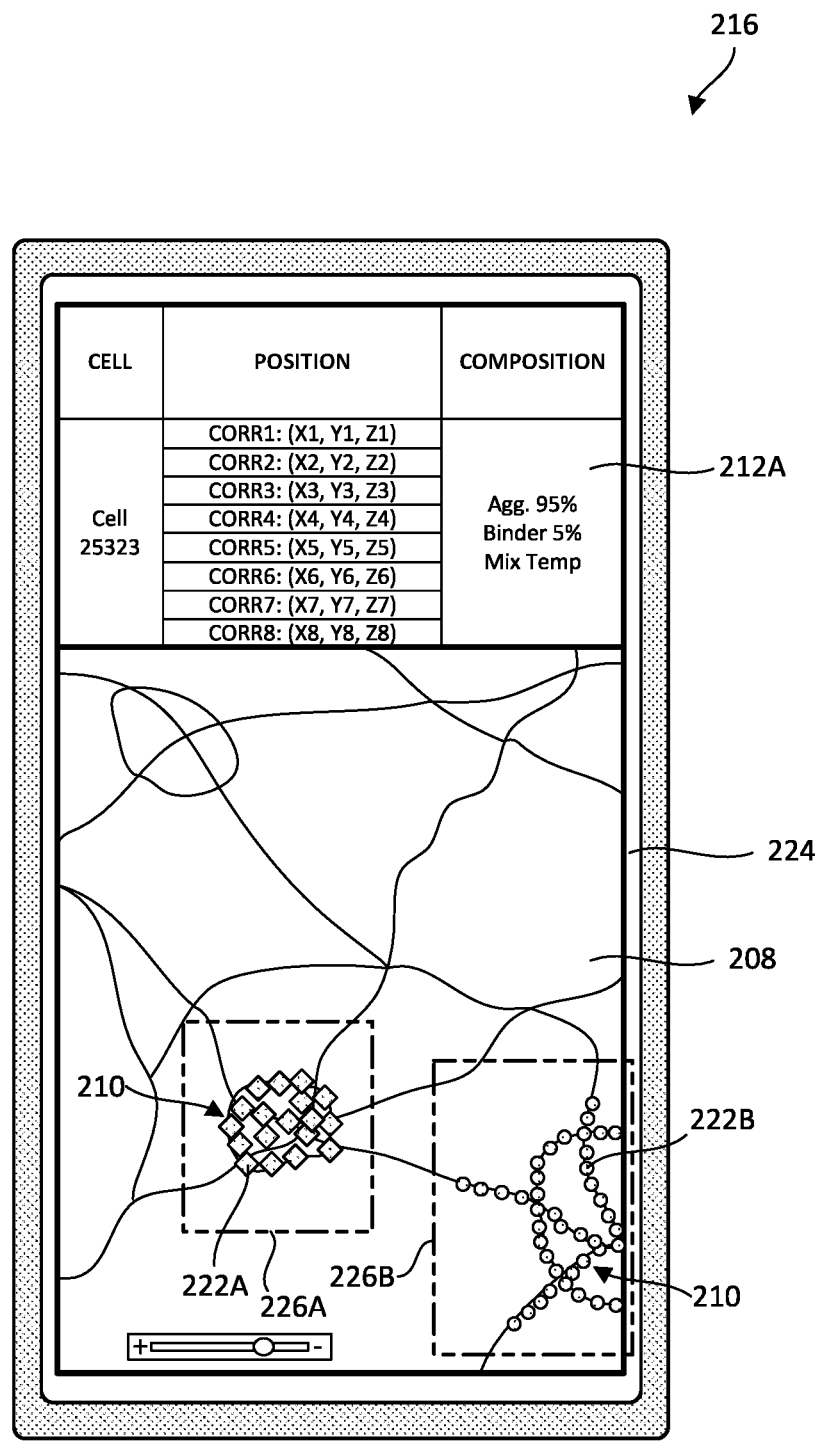
FIG. 10 depicts a user device displaying a map, map overlay, and data readout according to an embodiment of the present invention.

Finally, with reference to FIG. 10, there is shown a user device 216 (e.g., a smartphone) having a display 224 for displaying a map and map overlay, as discussed above. A digital map 208 of a real-world location is located is displayed on a lower portion of the display 224 of the user device 216. A digital reconstruction 210 of portions of the paved road area is overlaid onto the map 208. This digital reconstruction 210 is divided into two different jurisdictions, namely jurisdiction 226A and jurisdiction 226B. Jurisdiction 226A is provided with a plurality of user-selectable digital road segments 222A that each correspond to a different road portion within that specific jurisdiction. Similarly, jurisdiction 226B is provided with a plurality of user-selectable digital road segments 222B that each correspond to a different road portion within that specific jurisdiction. When a user clicks on any one of these road segments 222, at least a portion of the information stored to a cloud-based data set 212 (such as that shown in FIG. 7) is displayed is a data readout 212A at the top of the display 224, provided that that information can be accessed by that particular user.

Although this description contains many specifics, these should not be construed as limiting the scope of the invention but as merely providing illustrations of some of the presently embodiments thereof, as well as the best mode contemplated by the inventors of carrying out the invention. The invention, as described herein, is susceptible to various modifications and adaptations, and the same are intended to be comprehended within the meaning and range of equivalents of the appended claims.

What is claimed is:

1. A method for storing and providing historical pavement data related to a selected paved road portion of a paved road area having one or more paved roads that each include a plurality of paved road portions that are each paved by a separate asphalt lot, the method comprising the steps of:
  providing a computer-based tracking and mapping system that is configured to receive, store, track, and present to a user on a user device of the system pavement data related to pavement used in constructing the road portions;
  with a server of the tracking and mapping system, providing an as-built model of the paved road area that is comprised of:
    a digital map of a real-world location where the paved road area is located;
    a digital road model that overlays onto the digital map and that replicates one or more of the paved roads, the digital road model comprised of a plurality of user-selectable digital road segments for each of the one or more paved roads, wherein each of the user-selectable digital road segments corresponds to and is created in the digital road model based on only one of the plurality of road portions of one of the paved roads;
    a unique pavement data set associated with each of the user-selectable digital road segments that includes pavement data related to the asphalt lot used in forming the corresponding one road portion;
  with the server of the tracking and mapping system, in response to one of the user-selectable digital road segments being selected, updating a display of the user device to replicate and display at least a portion of the unique pavement data set that corresponds to the selected digital road segment.

2. The method of claim 1 wherein only unique pavement data corresponding to the selected digital road segment is displayed in response to one of the displayed user-selectable digital road segments being selected.

3. The method of claim 1 wherein the pavement data includes pavement composition data related each asphalt lot used in forming each road portion and, in response to one of the displayed user-selectable digital road segments being selected, the display of the user device is updated to replicate and display the pavement composition data related to the asphalt lot used in forming the road portion that corresponds to the selected digital road segment.

4. The method of claim 1 further comprising the step of, in response to the tracking and mapping receiving current location information from a user device that indicates that the user device is located at one of the plurality of road portions of the paved road having a corresponding user-selectable digital road segment contained in the as-built model, automatically selecting that user-selectable digital road segment that corresponds to the one paved road portion where the user device is located such that at least a portion of the data set that corresponds to the road portion is replicated on the user device.

5. The method of claim 1 further comprising the step of, with the tracking and mapping system, creating the as-built model of the paved road area and automatically updating at least a portion of the as-built model in response to receiving new information related to the paved road.

6. The method of claim 5 wherein the unique pavement data set is also automatically updated in response to the tracking and mapping system receiving new information related to the paved road.

7. The method of claim 5 further comprising the step of, with the tracking and mapping system, receiving new information related to one road portion of the paved road from a road paving machine during a road paving process of the one road portion.

8. The method of claim 7 wherein the new information received from the road paving machine includes geographic coordinates that correspond to a location of a paved road created by the road paving machine, and wherein the as-built model is updated with the geographic coordinates.

9. The method of claim 8 wherein the geographic coordinates received from the paving machine correspond to a geographic location of a tag placed into the paved road.

10. The method of claim 1 wherein each of the user-selectable road portions visually represents a plurality of geographic coordinates that all correspond to and define a shape of the corresponding one road portion of the paved road such that a shape of each user-selectable road portion approximates the shape of the corresponding one road portion of the paved road.

11. The method of claim 1 wherein the pavement data of each unique data record includes data providing asphalt composition, asphalt age, and asphalt origin information for an asphalt lot used in forming the road portion that corresponds to the unique data record.

12. A method for creating an as-built model of a paved road area having one or more paved roads that each include a plurality of road portions that are each paved by a separate asphalt lot, the method comprising the steps of:
  providing a computer-based tracking and mapping system that is configured to receive, store, track, and present to a system user on a user device pavement data related to pavement used in constructing the paved road area;
  with a server of the tracking and mapping system, receiving paving data related to at least one of the one or more paved roads, the paving data for each paved road including at least pavement data including an identification of the asphalt lot used in forming each of the plurality of road portions and a plurality of geographic coordinates identifying a location of each of the road portions of the paved road;
  with the server of the tracking and mapping system, based on the paving data, creating an as-built model of the paved road area that is comprised of:
    a digital map of a real-world location where the paved road area is located;
    a digital road model overlaid onto the digital map that replicates the at least one paved road, the digital road model comprised of a plurality of user-selectable digital road segments for each of the one or more paved roads, wherein each of the user-selectable digital road segments corresponds to and is created in the digital road model based on only one of the plurality of road portions of one of the paved roads;

a unique pavement data set for each of the one or more of the plurality of road portions, each unique pavement data set comprising the paving data for the corresponding one road portion;

with the server of the tracking and mapping system, in response to one of the user-selectable digital road segments being selected, updating a display of the user device to replicate and display at least a portion of the unique pavement data set that corresponds to the selected digital road segment.

13. The method of claim 12 further comprising the step of updating the as-built model with the paving data received.

14. The method of claim 12 wherein the paving data is received by the tracking and mapping system from a road paving machine.

15. The method of claim 14 wherein the paving data is transmitted from the road paving machine in real time as a road portion is being paved by the road paving machine and the paving data transmitted relates to the road portion being paved.

16. The method of claim 12 further comprising the step of providing access to the as-built model to a user via a user device and, in response to one of the user-selectable digital road segments being selected, displaying at least a portion of the as-built model on the user device.

17. The method of claim 16 further comprising the steps of: providing a first user with access to only a first portion of the as-built model related to a first portion of the paved road area; and providing a second user with access to only a second portion of the as-built model related to a second and geographically different portion of the paved road area.

18. The method of 17 further comprising the step of providing a third user with access to the first portion of the as-built model and the second portion of the as-built model.

19. The method of claim 16 further comprising the step of, in response to the tracking and mapping receiving current location information from the user device that indicates that the user device is located at one of the plurality of road portions of the paved road having a corresponding user-selectable digital road segment contained in the as-built model, automatically selecting that user-selectable digital road segment that corresponds to the one paved road portion where the user device is located.

20. The method of claim 12 wherein each of the plurality of geographic coordinates correspond to a different geographic location of a tag placed into the paved road area.

* * * * *